United States Patent [19]
Shaver et al.

[11] Patent Number: 5,541,501
[45] Date of Patent: Jul. 30, 1996

[54] LIGHTNING AND STORM WARNING METHOD AND APPARATUS

[75] Inventors: Edward F. Shaver, Lutz; John F. Kohls; Richard I. Kohls, both of Pinellas Park; Paris H. Wiley, Tampa; Stephen L. McCarter, St. Petersburg, all of Fla.

[73] Assignee: Skyscan Technologies, Inc., Tampa, Fla.

[21] Appl. No.: 155,743

[22] Filed: Nov. 23, 1993

(Under 37 CFR 1.47)

Related U.S. Application Data

[63] Continuation-in-part of Ser. No. 873,786, Apr. 27, 1992, Pat. No. 5,263,368.

[51] Int. Cl.$^6$ .................................................. G01N 31/02
[52] U.S. Cl. .................. 324/72; 73/170.24; 342/460; 364/420
[58] Field of Search .............................. 324/72; 364/420; 342/460; 73/170.24

[56] References Cited

U.S. PATENT DOCUMENTS

| | | | |
|---|---|---|---|
| 4,672,305 | 6/1987 | Coleman | 324/72 |
| 4,803,421 | 2/1989 | Ostrander | 324/72 |

*Primary Examiner*—Kenneth A. Wieder
*Assistant Examiner*—Jose M. Solis
*Attorney, Agent, or Firm*—Edwin E. Greigg; Ronald E. Greigg

[57] ABSTRACT

A lightning ranging device which utilizes two frequencies in the field generated by a lightning discharge to determine range. The relative amplitudes of the outputs from two tuned receiver channels varies with distance from the lightning stroke. A two-dimensioned look-up table with two inputs and one output can be utilized to output the range. The original ratio of the amplitudes of the two frequencies can be determined empirically from experimental data and amplification factors on the two frequency channels are pre-set at different levels to compensate for this difference in the original energy level.

20 Claims, 9 Drawing Sheets

LIGHTNING AND STORM WARNING METHOD AND APPARATUS

This is a continuation-in-part of U.S. patent application Ser. No. 873,786 filed Apr. 27, 1992, issued as U.S. Pat. No. 5,263,368.

BACKGROUND OF THE INVENTION

This invention relates to an apparatus for the detection and ranging of lightning discharges. The device may be sufficiently small to be carried in the hand and in the pockets of normal garments of apparel.

Previous developments in the field of lightning detection include ranging systems in which the distance to lightning is determined (U.S. Pat. No. 3,715,660 to Ruhnke). More elaborate devices display both azimuth and distance to the lightning activity (U.S. Pat. No. 4,023,408 to Ryan et al; U.S. Pat. No. 4,422,037 to Coleman). These inventions typically employ cross-loop antennas to detect the magnetic field component of the radiation which emanates from lightning activity and nondirectional radio antennas to detect the electric component. Comparisons of the magnetic and electric field strengths then yield approximate distances to lightning strikes.

Some devices include components which perform waveform analysis in order to distinguish lightning activity from other natural or man made electromagnetic radiation (U.S. Pat. No. 4,115,732 and U.S. Pat. No. 4,198,599 to Krider et al).

Other systems employ principals of interferometry to locate lightning activity (U.S. Pat. No. 4,841,304 to Richard et al.) or the phenomena of induced corona discharge to detect the potential of lightning strikes (U.S. Pat. No. 4,823,228 to Bittner).

Most such devices are conceived as fixed, land based installations or airborne instruments involving substantial size, weight and expense.

SUMMARY OF THE INVENTION

According to the present invention the detection and ranging of a lightning stroke is based on the fact that lightning generates a field which is spread over a large portion of the frequency spectrum and the various frequency components of that field behave differently with respect to distance from the lightning stroke. By utilizing two different frequency components of the field, this invention is able to eliminate the effects of varying magnitudes of lightning strokes and still determine the range to the stroke.

While utilizing the two frequency components, one must be aware that the frequency components in a field emanating from a lightning stroke do not originate with equal amplitudes. Ryan et al U.S. Pat. No. 4,023,408 discusses the frequency spectrum of the field and FIG. 2 of the patent shows the general shape of the spectrum. That figure shows that at frequencies below 7 kHz the amplitudes of the frequency components diminish at a 6 DB/octave rate. This original underlying difference in amplitudes can be factored out by appropriately adjusting the amplifications applied to the two frequency components when implementing this invention, as will be discussed below.

The properties of the field generated by a lightning stroke which make the present invention possible can best be understood by starting from the equations for the electric and magnetic parts of the field emanating from a lightning stroke: For the electric field, $$E_\theta = \frac{Il}{4\pi} e^{-jkr} \left( \frac{j\omega\mu}{r} + \frac{\eta}{r^2} + \frac{1}{j\omega\epsilon r^3} \right) \sin\theta \qquad (1)$$

and for the magnetic field, $$H_\phi = \frac{Il}{4\pi} e^{-jkr} \left( \frac{jk}{r} + \frac{1}{r^2} \right) \sin\theta \qquad (2)$$

where

I is the magnitude of the current flow in amperes, l is the length of the stroke, r is the distance to the stroke, μ is the permeability of free space, ε is the permittivity of free space, η is the square root of the ratio μ/ε, sinθ is equal to 1 when the observer is in a direction perpendicular to the lightning stroke, $e^{-jkr}$ represents the sinusoidal variation of the field with respect to time and position and may be considered equal to 1 for purposes of this discussion, and k is the free space propagation constant and is defined as follows, $$k = \frac{2\pi f}{c} \qquad (3)$$

where f is the frequency in Hertz and c is the velocity of light ($3 \times 10^8$ m/s).

According to the invention either the electric or magnetic field may be used for determining lightning range. Taking the magnetic field of equation (2), for example, it can be seen that the magnetic field is separable into two component parts which are:

$$H_{\phi 1} = j \frac{Ilk}{4\pi r} \qquad (4)$$

and $$H_{\phi 2} = \frac{Il}{4\pi r^2} \qquad (5)$$

A comparison of equations (4) and (5) shows that the former is inversely proportional to distance (r) while the latter is inversely proportional to distance squared ($r^2$). Therefore $H_{100\ 1}$ will be larger and will dominate at large distances from the lightning stroke while $H_{100\ 2}$ will dominate at close distances from the lightning stroke. A further comparison of these equations reveals that, except for the original underlying amplitude differences discussed in relation to the Ryan et al patent above, $H_{100\ 1}$ is also directly dependent on frequency (since k is directly dependent on frequency) while $H_{100\ 2}$ is independent of frequency, except for the original underlying amplitude differences discussed above. It is this fact that makes it possible to estimate the distance to a lightning stroke by making a measurement of the field strengths at two distinct frequencies. When the stroke is close, $H_{100\ 2}$ will dominate and the field strength levels at the two frequencies will be the same since $H_{100\ 2}$ is independent of frequency except for the underlying differences in amplitudes discussed above. However, when the stroke is far away, $H_{100\ 1}$ will dominate and the ratio of the field strengths will be the same as the ratio of the two frequencies used to make the measurement since $H_{100\ 1}$ is directly proportional to frequency, again except for the underlying amplitude differences discussed above. It can be seen that as the distance to the lightning stroke varies from very near to very far the ratio of the field strengths at the two frequencies varies continuously from unity to the ratio of the two frequencies, after the original underlying differences in amplitude are factored out.

When using magnetic loops to detect the magnetic field at the two frequencies, the ratio of the voltage outputs of the receiver at the two distinct frequencies chosen for operation depends, first of all, on the strength of magnetic fields at those frequencies, but it also depends on several other factors. With reference to the two magnetic field components set forth in equations (4) and (5), the equations for the two corresponding component voltage outputs at a given frequency are derived as follows: For the $H_{100\ 1}$ component, $$V_{out1} = K_f 8(10^{-7})\pi^2 fnAGH_{\phi 1} \tag{6}$$

and for the $H_{\phi 2}$ component, $$V_{out2} = K_f 8(10^{-7})\pi^2 fnAGH_{\phi 2} \tag{7}$$

In the above two equations,

A=cross-sectional area of the receiving antenna, n=numbers of turns of wire in receiving antennas, G=the gain in sensitivity of the antenna loop with ferrite core material over the sensitivity of the antenna loop in vacuum, and $K_f$=a constant which depends on the amount of energy originally generated by the lightning stroke at the frequency of interest.

Since the two component voltages are 90° out of phase, the total output voltage at the frequency in question is:

$$V_{out} = \sqrt{V_{out1}^2 + V_{out2}^2} \tag{8}$$

For a ranging device built according to the invention using two frequencies $f_1$ and $f_2$, the ratio of the voltage outputs of the two channels would be $$\text{Ratio} = \frac{K_{f_1} f_1 \sqrt{\left(\frac{k_1}{r}\right)^2 + \left(\frac{1}{r^2}\right)^2}}{K_{f_2} f_2 \sqrt{\left(\frac{k_2}{r}\right)^2 + \left(\frac{1}{r^2}\right)^2}} \tag{9}$$

Near the lightning stroke the $1/r^2$ terms dominate in the above equation and the ratio approaches $$\text{Ratio} = \frac{K_{f_1} f_1}{K_{f_2} f_2} = K\left(\frac{f_1}{f_2}\right) \tag{10}$$

where $K = K_{f_1}/K_{f_2}$.

Far from the lightning stroke the $k/r$ terms dominate in equation (9) and the ratio approaches $$\text{Ratio} = \frac{K_{f_1} f_1 k_1}{K_{f_2} f_2 k_2} = K\left(\frac{f_1}{f_2}\right)^2 \tag{11}$$

since $k_1$ is directly dependent on $f_1$ and $k_2$ is directly dependent on $f_2$ as shown in equation (3).

It can be seen from equations (10) and (11) that as the distance from the lightning varies from near to far, the ratio of the output voltages from the two frequency channels varies from K times the ratio of the frequencies to K times the ratio of the squares of the frequencies. K depends on the ratio of the amounts of energy originally generated by the lightning stroke at the two frequencies involved and can be determined empirically from experimental data. As stated above, the Ryan et al patent shows in general how the originally generated energy varies with frequency. By adjusting the amplification factors in the two receiver channels to compensate for the difference in the energy levels originally generated by the lightning stroke, the value of K can be set equal to one. Once K has been set equal to one, equations (10) and (11) show that the output voltage ratio varies from the ratio of the frequencies to the ratio of the square of the frequencies as the distance varies from near to far.

For each lightning stroke there is a unique value of range corresponding to the ratio of the output voltages from the two frequency channels. Extensive tests with actual devices have confirmed the above equations.

A significant benefit of this invention's approach to the ranging of lightning activity is the removal of the effects of wide variations in the magnitudes of the lightning strokes themselves. These magnitudes, as cited in many sources, extend from less than 10 kA to more than 200 kA and this in turn causes corresponding wide variations in the fields of lightning strokes. This invention avoids errors in range by factoring these variations into the detection and ranging process.

In addition to determining the range of individual lightning strokes the invention will also recognize meteorological conditions that are considered most likely to produce localized severe storm phenomenon. It is an accepted principle of meteorology (Grazulis, Thomas P., "Significant Tornados 1680–1991", Environmental Films, St. Johnsbury, Vt., 1993 and others) that certain types of thunderstorms are most likely to produce severe localized weather conditions and that two types of thunderstorms in particular are most likely to spawn these conditions: squall-line thunderstorms, and multi-draft supercells. Squall-line thunderstorms are formed in lines up to several hundred miles long at the collision of a warm front and a cold front. Multi-draft supercells are formed by multiple updrafts providing excessive amounts of energy to a storm cell.

The invention detects and identifies both of these meteorological conditions by tracking statistical patterns in the lightning strokes detected from a storm cell. In the case of the squall-line thunderstorm, the invention looks for a predetermined level of lightning activity in a predetermined time interval occurring across a number of range intervals. Once detected, this condition would imply the presence of a storm extending spatially beyond the expected limits of an ordinary storm cell. Multi-draft supercells are recognized by detecting lightning activity levels above predetermined limits in specific range intervals. Once detected, this condition would imply the presence of a localized storm cell of significantly greater intensity than an ordinary storm cell, and therefore one that might be a developing or mature multi-draft supercell.

Accordingly, it is an object of the invention to determine the range of a lightning stroke by utilizing two narrow frequency bands in the field emanated by the lightning stroke and relying on the relationship between the energy levels detected in these bands to determine range.

Another object of the invention is to determine the range of a lightning stroke by utilizing the ratio of strengths of the field emanating from the lightning in two different frequency bands.

A further object of the invention is to compensate for the variation in amplitudes with frequency present in the spectrum initially generated by the lightning stroke and doing this compensation before the amplitude readings are used to detect range.

It is also an object of the invention to determine the range of a lightning stroke to greater distances and greater accuracy by utilizing the ratios of strength of the field as detected in multiple pairs of frequency bands.

Still another object of the invention is to determine the range of a lightning stroke by utilizing a computerized look-up table in converting the strengths of the field emanating from the lightning in two different narrow frequency bands into range information.

A further object of the invention is to determine the range of a lightning stroke by utilizing two frequencies in the field emanated by the lightning stroke while reducing the effects of background noise and other types of electrical discharges.

Yet another object of the invention is to detect the danger of a severe storm by detecting large numbers of lightning strokes spread over more than one range interval or detecting a large number of lightning strokes confined to a single range interval.

BRIEF DESCRIPTION OF THE DRAWINGS

The invention may be further understood by reference to the drawings in which.

DESCRIPTION OF THE PREFERRED EMBODIMENT

The principles of the invention can be used in many applications. They can be embodied in ground installations, airborne installations, portable devices, etc. A preferred embodiment of the invention in a small portable lightning and storm detection device will now be described. In such a device the size of the receiving antenna is a primary consideration.

The most elementary antennas for detecting the field generated by a lightning stroke are the magnetic loop for detecting the magnetic field and the electric dipole for detecting the electric field. The printed circuit board inside the case of a portable device can serve as one half of an electric dipole. However, for proper operation, the second half of the electric dipole would extend outside the case. If the second half of the electric dipole is folded back in the same direction as the first half (in order to fit inside the case), the received signal would be approximately zero. In addition, if the printed circuit board is not used as one half of the electric dipole and both halves of the dipole are fitted inside the case, then the metal traces on the printed circuit board will tend to short out the electric field and again reduce the received signal to zero.

In contrast to an electric dipole antenna, the magnetic loop antenna may be fitted inside the case of a small portable device. The metal traces on the printed circuit board have virtually no effect on the magnetic field and a loop antenna will work equally well inside the case as outside. For these reasons a magnetic loop was chosen as the preferred antenna for the portable lightning and storm detector.

Figure 1:
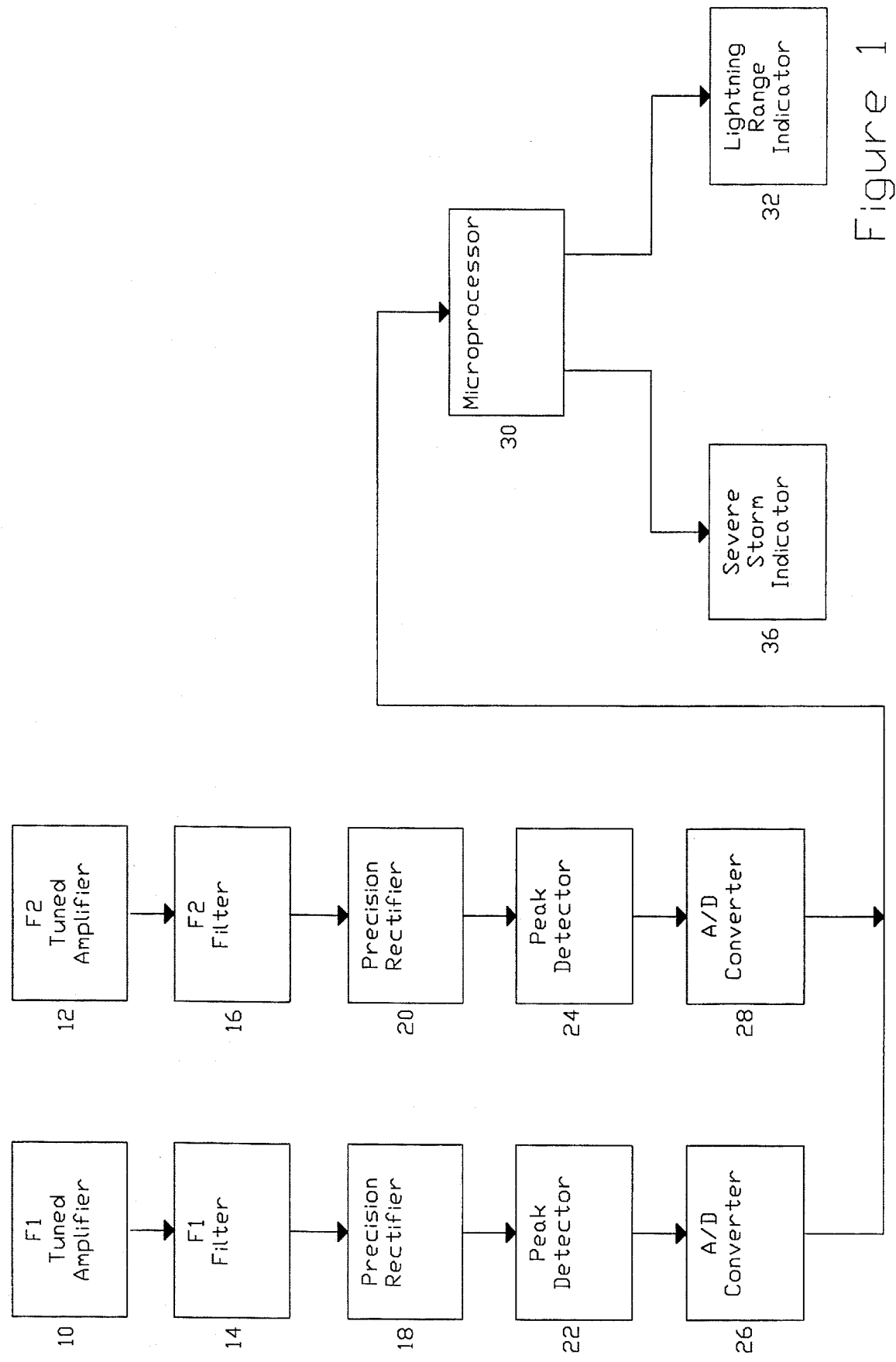
FIG. 1 is a generalized block diagram of an embodiment of a lightning detection and ranging apparatus according to the invention.

FIG. 1 is a block diagram of a lightning and storm detection device. Blocks 10 and 12 are two wire-wound ferrite core antennas, each with capacitive/inductive tuning to receive a narrow frequency range of the field emanating from the lightning stroke.

The $f_1$ and $f_2$ frequency signals from the tuned antennas are passed to low pass filters 14 and 16. From the low pass filters the signals are passed respectively to two precision rectifier stages 18 and 20. The gain settings of the lowpass filters and precision rectifiers are chosen to compensate for the difference in energy levels of the two frequencies in the original field emanating from the lightning stroke. By incorporating different predetermined gain settings in the two channels, one is able to compensate for the variation in amplitudes present in the spectrum initially generated by the lightning stroke and, therefore, the variations due to distance can be analyzed cleanly in the outputs of stages 18 and 20. The precision rectifier stages produce accurate measures of the signal amplitudes of the two selected frequencies from the lightning stroke. The rectified signals from stages 18 and 20 are then passed to a pair of peak detectors 22 and 24. The voltages from the peak detectors are read repeatedly and fed to two analog-to-digital converters 26 and 28 to produce pairs of digital values corresponding to the analog values received from the peak detectors. These repeated readings are made continuously, not just at the peaks. The peak detectors decay to zero volts in between peaks and this fact is used in software in measuring the rise time of the peak. Peak detectors 22 and 24 guarantee that the pairs of actual peak voltages are indeed measured before the pairs of voltages are used to determine the range of the lightning strokes. The determination of the peak values is made digitally as will be described below with reference to FIG. 5(c).

As explained in the summary above, the ratios of these pairs of output voltages correspond to unique lightning stroke ranges. In order to derive ranges from these pairs of digitized output voltages, the pairs of digital values corresponding to voltages are fed to microprocessor 30 which includes a two-dimensional selection array for selecting a stored value of range corresponding to each pair of input digital values. Microprocessor 30 can be programmed to accept data from A/D converters 26 and 28, access the selection array and produce range values corresponding to the pairs of digital inputs. Such a program can be written by an ordinarily skilled programmer, and an example of a flow chart for a program embodying these features is illustrated in FIG. 5(a) through FIG. 5(e) and is described below. Also as explained in the summary, the ratios of the output voltages from the two frequency channels, if the voltages resulted from actual lightning strokes, will be between the ratio of the two frequencies and the ratio of the squares of those two frequencies. If a valid pair of digital values is presented to the selection array, a corresponding range value for the detected lightning stroke is output from the array. This range value is then used by the lightning range indicator 32 to indicate the approximate range of the lightning stroke. Also these valid range values are temporarily stored and used, in appropriate cases, to trigger the severe storm indicator 36.

Also microprocessor 30 includes a range memory array which is used in detecting squall line thunderstorms and multi-draft supercells. As the lightning strokes are detected and their ranges determined, the history of these strokes by range is temporarily stored in the range memory array and if the number of lightning strokes in a number of contiguous range intervals exceeds a predetermined number in a predetermined time the possibility of a squall line thunderstorm is assumed and a severe storm warning is given by indicator 36. Likewise if the number of lightning strokes in a single range interval exceeds a predetermined number in a given amount of time the possibility of a multi-draft supercell is assumed and here also a severe storm warning is given by indicator 36.

Figure 2:
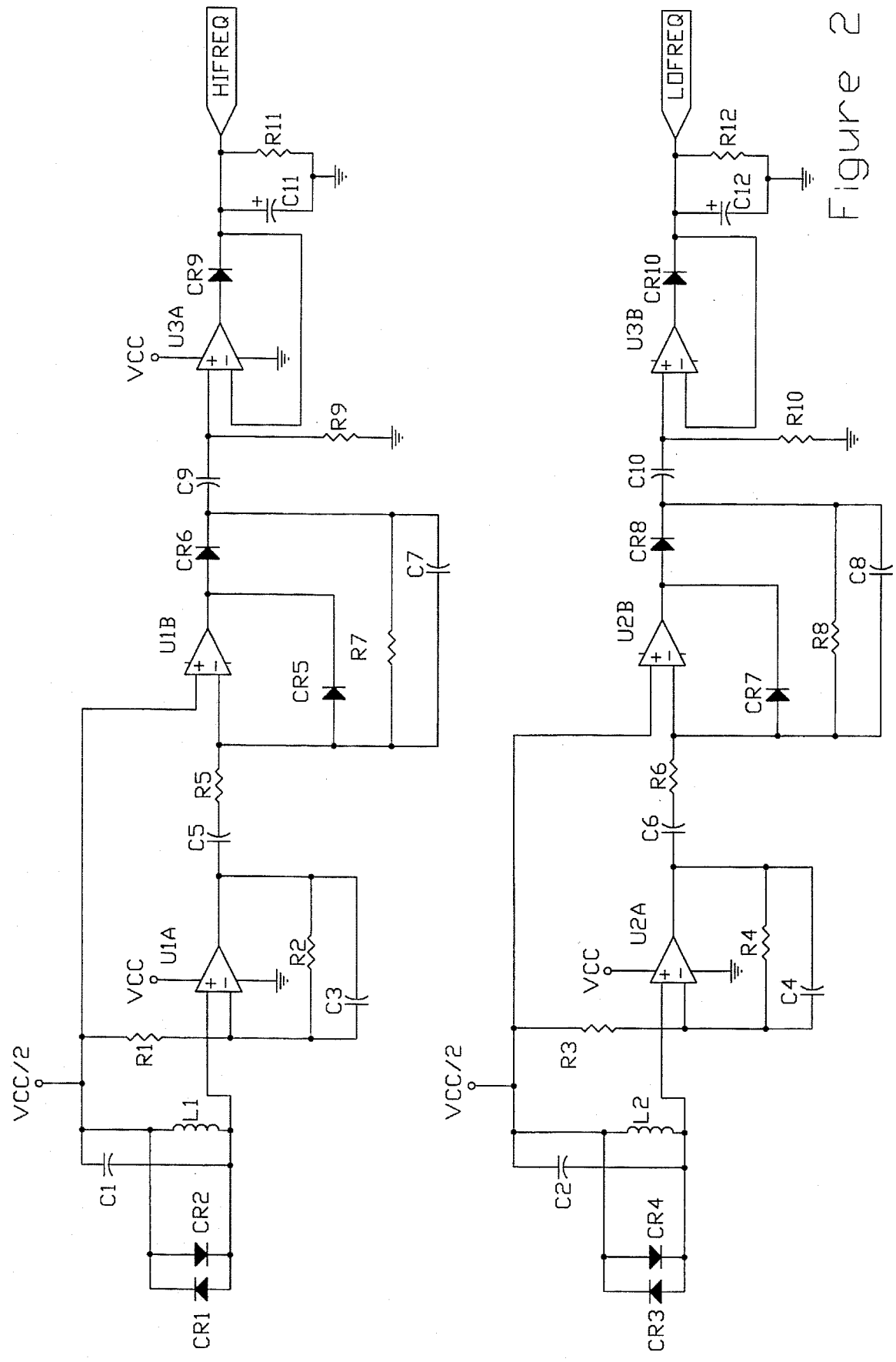
FIG. 2 shows the details of a first portion of an embodiment of the invention.
Figure 3:
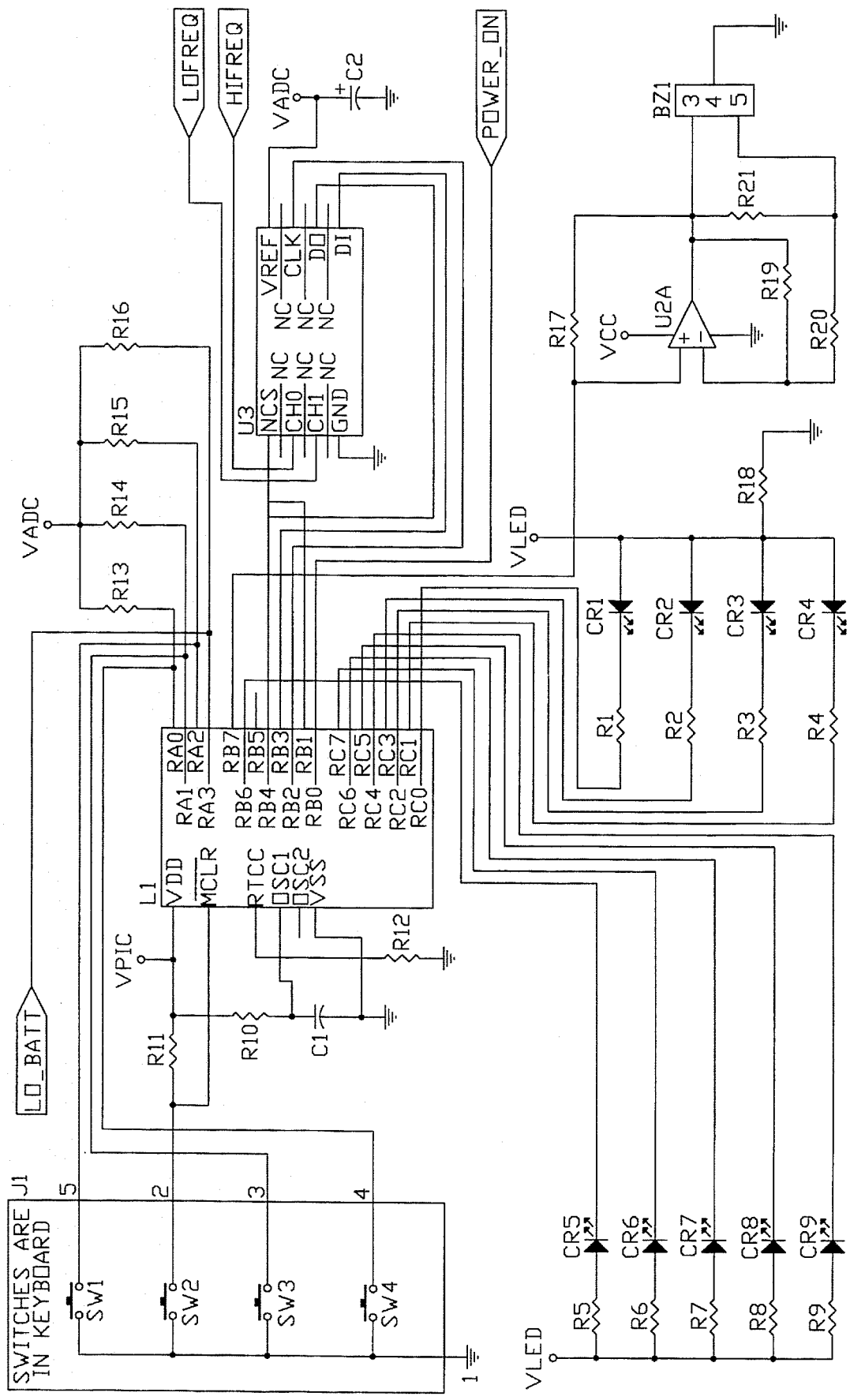
FIG. 3 shows the details of a second portion of an embodiment of the invention.
Figure 4:
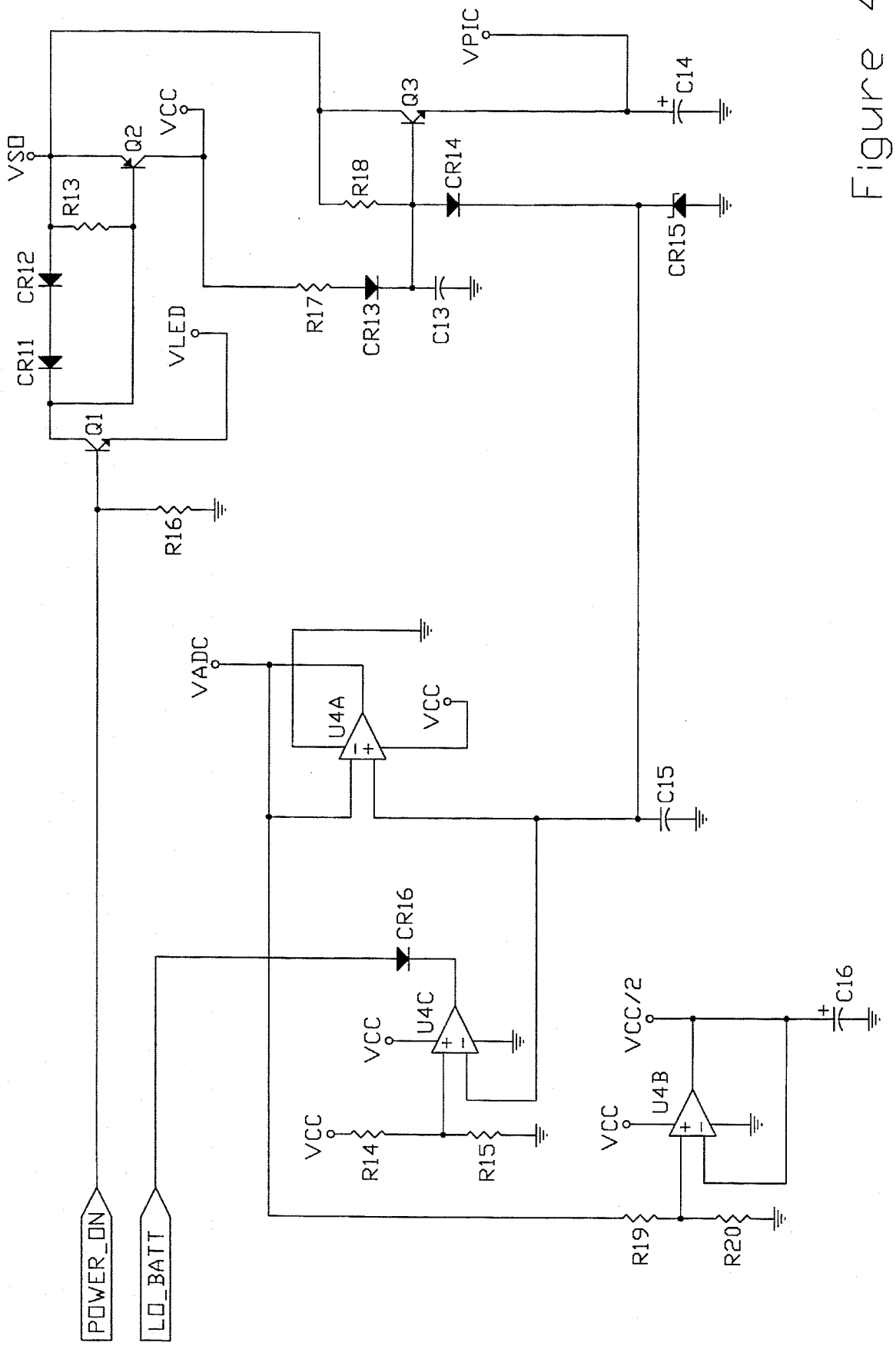
FIG. 4 shows the details of the power supply portion of an embodiment of the invention.

FIGS. 2, 3 and 4 show more details of a preferred embodiment of the invention. FIG. 2 shows the details of the system corresponding to blocks 10, 14, 18, 22, 12, 16, 20 and 24 in FIG. 1. The signal generated by a lightning stroke is coupled into the invention through antennas L1 and L2.

These antennas may be wire-wound ferrite core antennas, each with capacitive/inductive tuning to receive a narrow frequency range. Ferrite cores were used to provide amplification of the incoming signals and increase the signal-to-noise ratio of the final voltage level. Associated with the antennas are capacitors C1 and C2 for setting the respective frequencies of the antennas. For a handheld version of the invention the frequencies selected must have a ratio of at least 2 and not more then 5. The ratio can be any value, integer or non-integer, between 2 and 5. The selection of the frequencies is dependent on the final desired operation range of the embodiment, as well as the desired accuracy. For example, an embodiment with frequencies of 2.5 kHz and 10 kHz and amplification levels of 400 on the high frequency channel and 1000 on the low frequency channel would allow an operational range of 40 miles. Diodes CR1, CR2, CR3 and CR4 provide signal clamping protection for the input amplifiers to keep energy generated by close lightning strokes from damaging the amplifiers.

From the tuned antenna circuits, the respective signals are passed forward to a low pass filter with gain. These elements are comprised of U1A, R1, R2 and C3 in one path and U2A, R3, R4 and C4 in the other. In order to use battery power without resorting to a bipolar power supply, it can be seen that both chains are referenced to half battery voltage VCC/2 as their nominal input level. A detailed description of the power supply arrangements will be given below with reference to FIG. 4.

Capacitors C5 and C6 are used to keep the VCC/2 normal output level of the low pass filters from saturating the rectifier stages that follow the low pass filters, as well as to eliminate amplifier bias effects.

The precision rectifiers are comprised of R5, U1B, CR5, CR6, R7 and C7 in one signal path and R6, U2B, CR7, CR8, R8 and C8 in the other. This precision rectifier stage is also referenced to VCC/2 and generates as outputs the absolute values of the differences between the low pass filters' signals and VCC/2. This stage is necessary to accurately measure the signal amplitude of a given lightning stroke. Capacitors C9 and C10 are included to mitigate saturation and bias effects in the following stages.

The final step in each of the analog signal processing chains in FIG. 2 is to detect the peak intensity of the incoming signal. This is accomplished by R9, U3A, CR9, C11 AND R11 in one path and R10, U3B, CR10, C12 and R12 in the other. Resistors R9 and R10 provide ground signal references for the peak detectors, C11 and C12 are used for charge storage, and R11 and R12 bleed the capacitors to ground over time so that further lightning strokes may be detected.

Readings of the analog voltages on C11 and C12 are repeatedly scanned by analog-to-digital converter U3 in FIG. 3 where they are converted into their digital equivalents. These readings are made continuously while the capacitors are charged and discharged as well as at the peaks. The A/D converters may be on a single chip device such as National Semiconductor ADC0831 although other well known analog-to-digital converters may be used. The digital values may each be eight-bit binary values and may be retrieved as serial bits over a single line, as in the present embodiment, or as parallel bits over plural lines. These digital values are then forwarded to microprocessor U1 for further processing. The microprocessor may be a single chip device such as Microchip Technologies PIC16C55, with means to store and make available for further processing all the digital data corresponding to the signals received from the lightning stroke. Another option would be the use of a microprocessor with analog-to-digital converter built in and thus combine the functions of U1 and U3. One microprocessor providing this combination of functionality is the Motorola 68HC11. The current embodiment uses separate components for U1 and U3 as detailed above to achieve the lowest power consuming design and thus enabling the longest battery life.

Microprocessor U1 temporarily stores all the digital data received from the two frequency channels and analyzes this data to determine if it can be valid data originating from a lightning stroke. For example, the data pairs can be analyzed to determine if their individual rise times are consistent with a lightning event, and further to determine that each signal exceeds an environmental background, and if the ratio of each pair of values is between the ratio of the two preselected frequencies and ratio of the squares of those frequencies.

After it has been determined that at least the timing and amplitudes of a data pair are valid, the pair may be used to access a two dimensional selection array whose size is a function of the desired operational range and precision of the system. This two-dimensional selection array has a prestored range value for each of the pairs of possible valid inputs, and error codes for invalid inputs. This allows the selection matrix to both determine if the data ratio is valid and to provide an appropriate response. If the ratio is valid, the corresponding range to the stroke is retrieved. If the ratio is invalid, the error code response alerts the program that the data were not collected from a lightning event.

Microprocessor U1 can also include a memory array for use in detecting squall line thunderstorms and multi-draft supercells. As each lightning stroke is detected and its range determined, the range memory array in microprocessor U1 temporarily stores the history of these strokes by range and if the number of lightning strokes in a selected number of contiguous range intervals exceeds a predetermined number in a predetermined time, the possibility of a squall line thunderstorm is assumed and a warning is given by severe storm indicator 36 in FIG. 1. Likewise if the number of lightning strokes in a single range interval exceeds a predetermined number in a predetermined period of time, the possibility of a multi-draft supercell is assumed and a warning for severe storm activity is given by indicator 36.

FIG. 4 shows the power supply section of the invention. VSO is the voltage level supplied by the source to the system. The source may be a 9 V battery or may come from a 120VAC power source which is converted to 9 VDC. VCC is the voltage supplied to the peripheral devices by microprocessor U1 when it is needed, VLED is the level supplied to the LED indicators, VADC is the reference voltage for the analog-to-digital converter U3, VCC/2 is the antenna bias potential.

The source power, that is battery power in the present embodiment, is connected to the power system bus (and thence to microprocessor U1) by connecting a 9 volt battery to VSO. This voltage is applied across diodes CR4 and CR5 and to the base of transistor Q3 through resistor R4. The emitter of Q3 then floats at a regulated voltage approaching the Zener voltage of CR5. The low power voltage regulator portion of the system comprises elements R3, CR3, C1, R4, Q3, CR4, C3, CR5, AND C2. With Q1 turned off, the power consumption of this regulator is 3 micro-amperes and the power supplied to microprocessor U1 is maintained at about 3.5 volts. In this low-power sleep mode the regulator has extremely low quiescent current, which is required in order to provide reasonable operational battery life in a typical consumer electronic device.

A primary power conservation objective is to minimize the power consumption of the microprocessor. This is accomplished by reducing the clock speed of the microprocessor to approximately 30 kHz. Since operational current consumption of the microprocessor is directly proportional to clock frequency, operation at a speed of 30 kHz results in a 90–95 percent reduction of power consumption over a microprocessor operating at conventional clock speeds.

When the user presses power switch SW2 (FIG. 3), microprocessor U1 is brought out of its low-power sleep mode and sets terminal RB0 high. The Power On line from RB0 is connected to the base of transistor Q1. This turns on transistor Q1, which then provides power to the LEDs through power system bus VLED. This also turns on transistor Q2 by providing it base drive. Q2 in turn provides power to amplifiers U1A, U1B, U3A, U2A, U2B, and U3B (FIG. 2) through power system bus VCC. Current is derived from VCC bus to power microprocessor U1 the rest of the way up through resistor R3 and diode CR3. When this alternate current route is powered up, CR5 is pushed to its full Zener regulation mode and its voltage rises to 5.1 volts. Q3 continues to track the potential of CR5, and so its emitter voltage rises to about 5.0 volts.

When VCC is fully powered up, it also provides power to analog-to-digital converter power system bus VADC through amplifier stage U1A and to the resistor ladder comprised of R7 and R8. Amplifier stage U1B tracks this voltage level and its output is provided on power system bus VCC/2. With all the power system busses fully powered up, the system draws between 20 and 150 milli-amperes (depending on how many indicator LEDs are lighted), but draws only 50 micro-amperes of "wasted" current into the regulator to maintain voltage levels.

When the user again presses power switch SW2, the microprocessor sets the terminal RB0 low and the Power On line is set low. Q1 is thus turned off, followed by Q2. This turns off the amplifiers, and thence the power system busses VCC, VLED, VADC and VCC/2. When VCC falls, then current to Q3 again reverts to its quiescent level supplied to Q3 through R4, and the regulator again draws only 3 micro-amperes.

Microprocessor U1 can be programmed to carry out the above discussed storage and analysis and such a program can be written by an experienced computer programmer ordinarily skilled in the art. An example of a flow chart for a program embodying the above described features is illustrated in FIGS. 5 (a) through FIG. 5(e).

FIGS. 5 (a) and 5(b) display the logical operation of switches SW1, SW2, SW3 and SW4 in FIG. 3. SW1 is the Battery Save switch; SW2 is the Power On/Off switch; SW3 is the Tone switch; and SW4 is the Range switch. It should be noted that operation of the preferred embodiment requires a number of separate timers to be monitored and periodically reset as switches and corresponding functions are activated and de-activated by the user. Three primary timers are utilized in the preferred embodiment: a 5 hour timer; a one second timer; and a sixty second timer. These timer increments were selected as most efficient for the specific operational characteristics of the preferred embodiment as described above, and changing of these values will merely change the user interface characteristics of the device without affecting the lightning detection and ranging functions. The five hour timer is used to shut the system down if no switch on the device is pressed for a period of five hours.

In general, the activation of a switch will set a corresponding bit in the status register of microprocessor U1 (See blocks 2, 18, and 22 in FIGS. 5 (a) and 5(b)) and also initiate timers assigned to the specific switch functions and their corresponding output displays. The activation of SW2 which controls the POWER ON/OFF function of the device, includes configuration of the microprocessor for system start or low-power sleep mode. In the embodiment, a counter keeps track of how many times the unit has been turned on or off by counting each time SW2 is pressed. Each time the count is odd the microprocessor is put into its low power sleep mode. Each time the count is even, the system is fully powered up and normal operation begins.

Figure 5A:
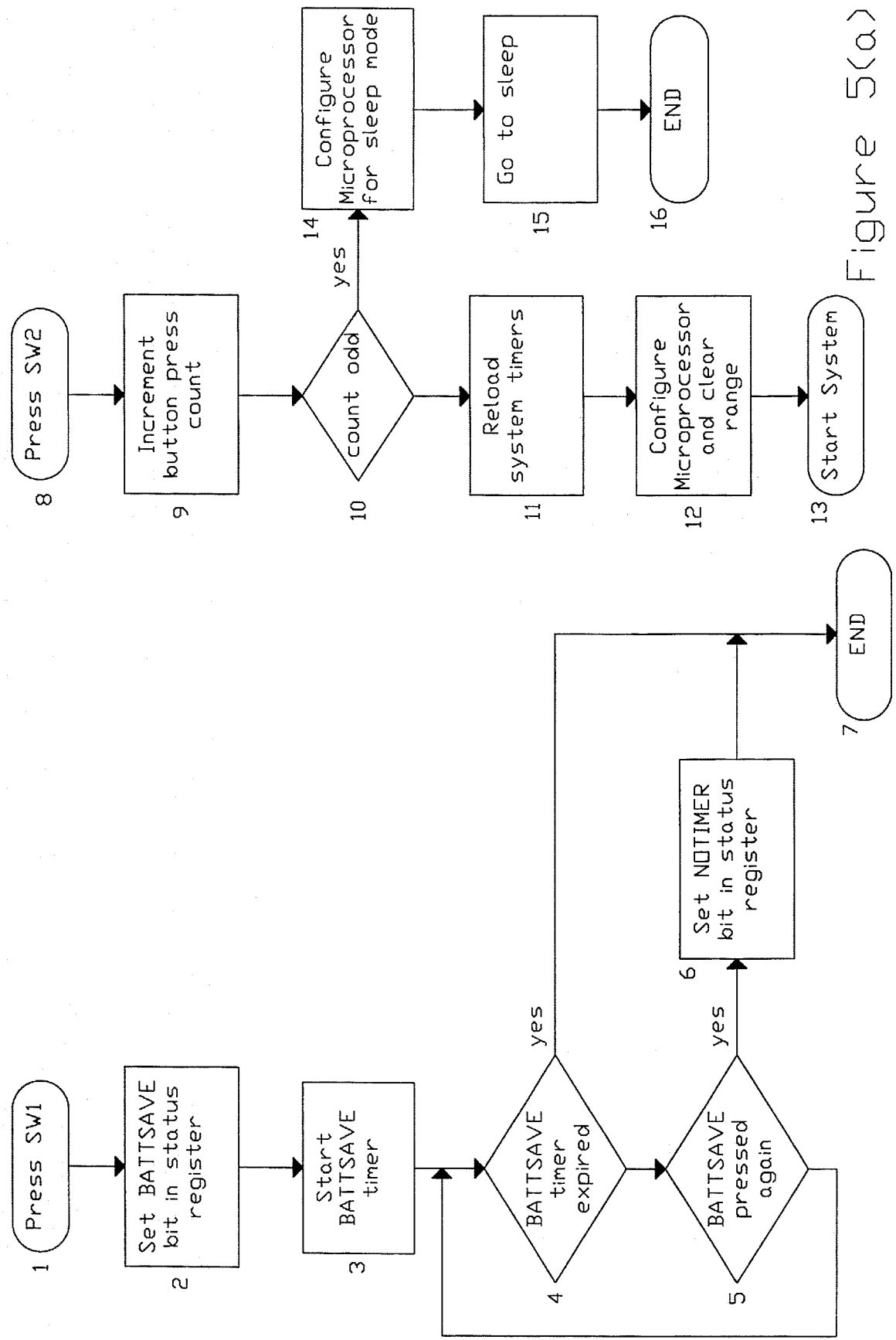
FIG. 5(a) through FIG. 5(e) taken together form a flow chart of a program to control the microprocessor indicated in FIG. 3.
Figure 5B:
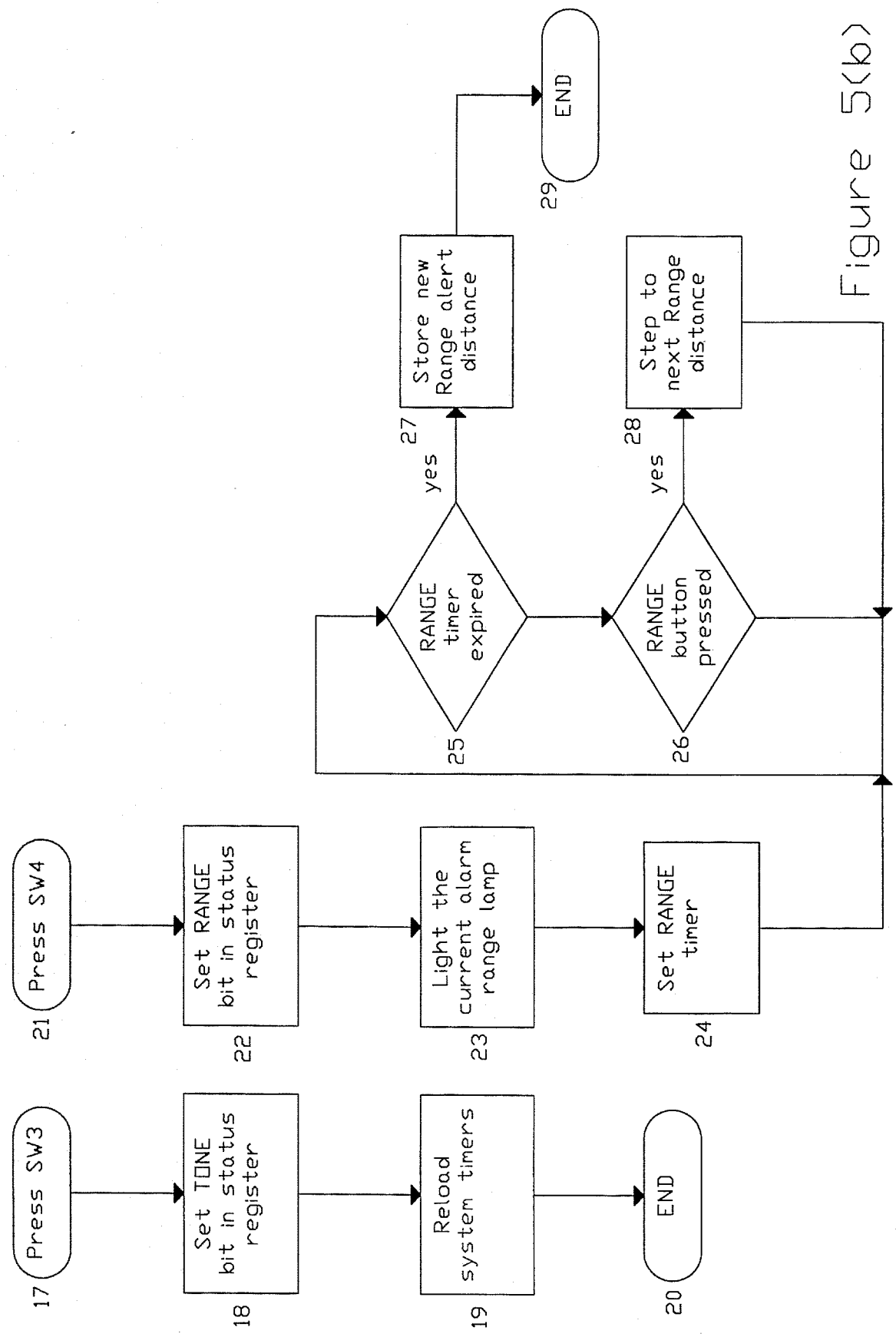

Activation of SW3 (see Block 17 in FIG. 5(b)) enables or disables the audible tone function of the embodiment. Activation of SW4 (see Block 21 in FIG. 5(b)) sets the selected detection range for activation of the audible tone. After a range has been selected the audible tone will sound each time lightning is detected within that range or closer. No audible sound will be emitted for lightning which occurs at a more distant range. Activation of SW1 (see block 1 FIG. 5(a) enables the Battery Save operational mode of the device.

Figure 5C:
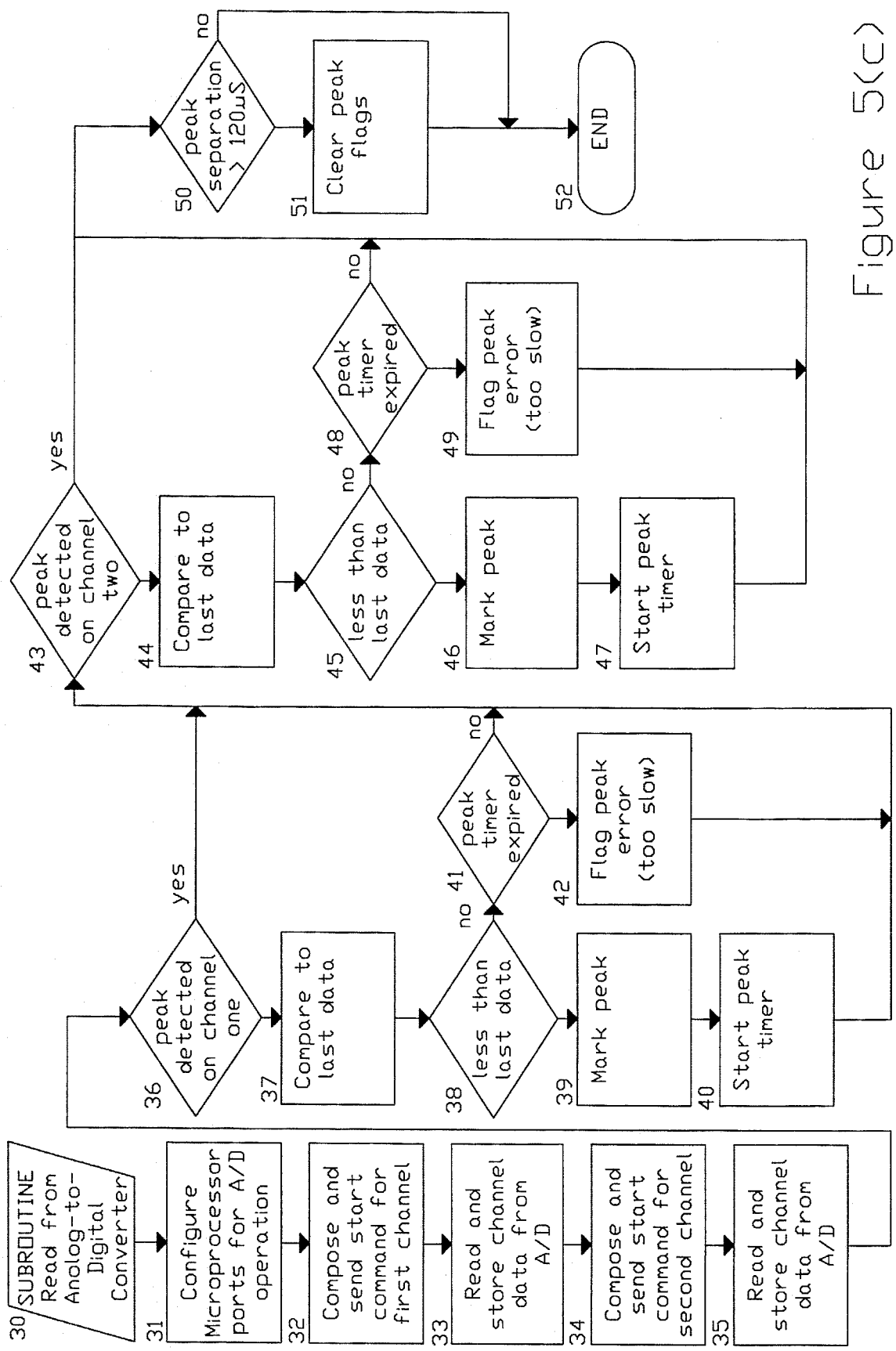

FIG. 5(c) describes the subroutine which reads the data from the analog-to-digital converter and determines the presence of a valid peak on both of the incoming frequency channels. A peak determination is accomplished by comparing each received data value with the previous data value until the newest received value is less than the previous one. In this way it is known that the previous value was a peak. Blocks 3–35 describe the general functions required for proper configuration of microprocessor to configure the A/D, read the incoming A/D data, and store the data for valid peak analysis. These functions are standard operating requirements in many digital devices and can be written by a programmer ordinarily skilled in the art. Precise determination of peak amplitude and chronology is made for one channel in Blocks 36–42, and for the other channel in Blocks 43–51. It is a critical part of the lightning peak identification function of the preferred embodiment that peaks be detected on both channels within a 120 microsecond operational window. Otherwise the peaks have not originated from the same electrical discharge. This determination is made at the comparison function of Block 50.

Figure 5D:
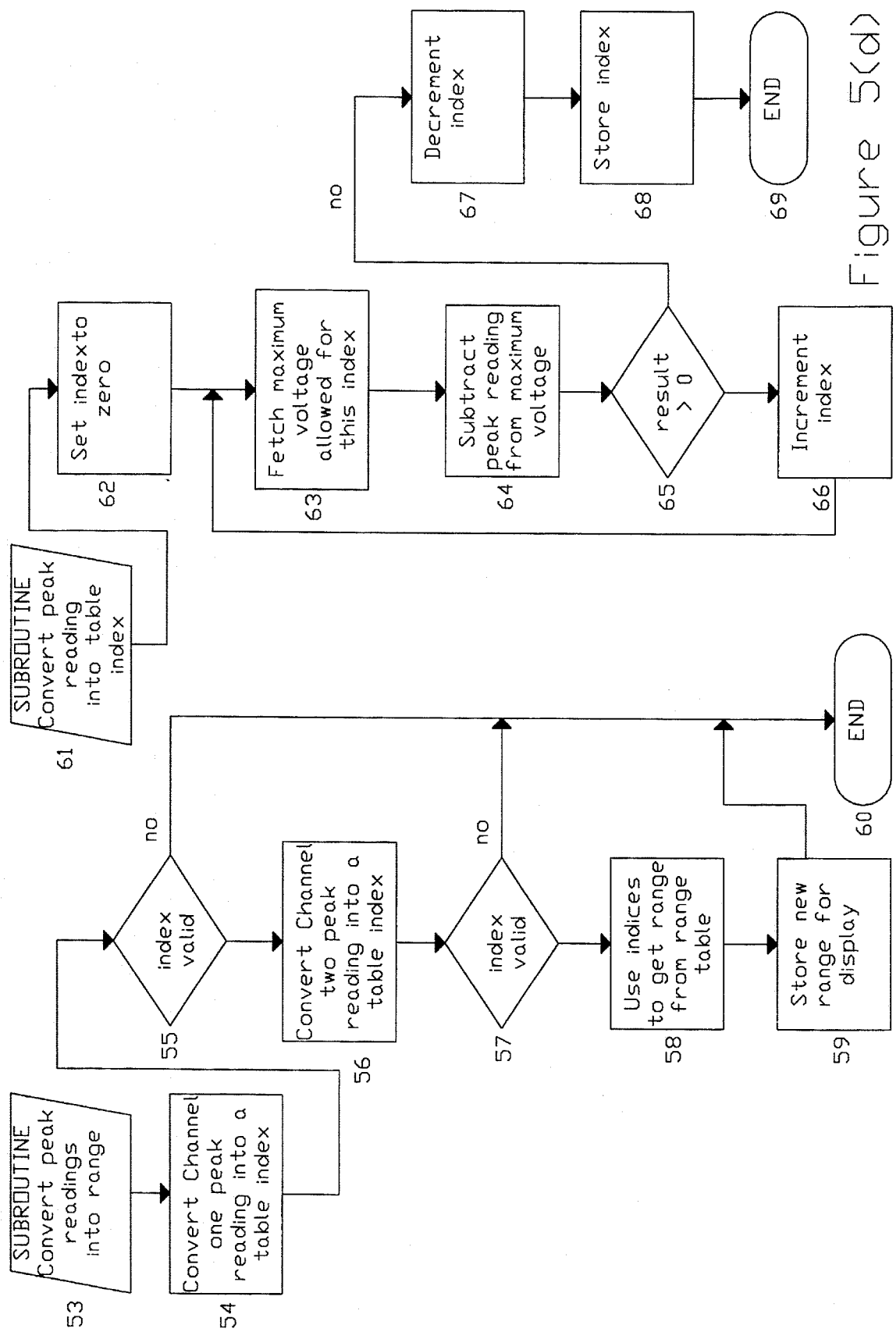

FIG. 5(d) describes the subroutine for converting the valid peak readings returned from Block 52 into a range to be displayed. This function consists of converting the peak readings into a table index, which is performed in block 61–69, and then performing a comparison to determine the validity of the calculated index. This validation of the calculated index is performed for both data channels, as shown in Blocks 54–57. As indicated, a valid index on both channels is required for a detected event to be assigned a range from the range table, which is performed in Blocks 58–59.

Figure 5E:
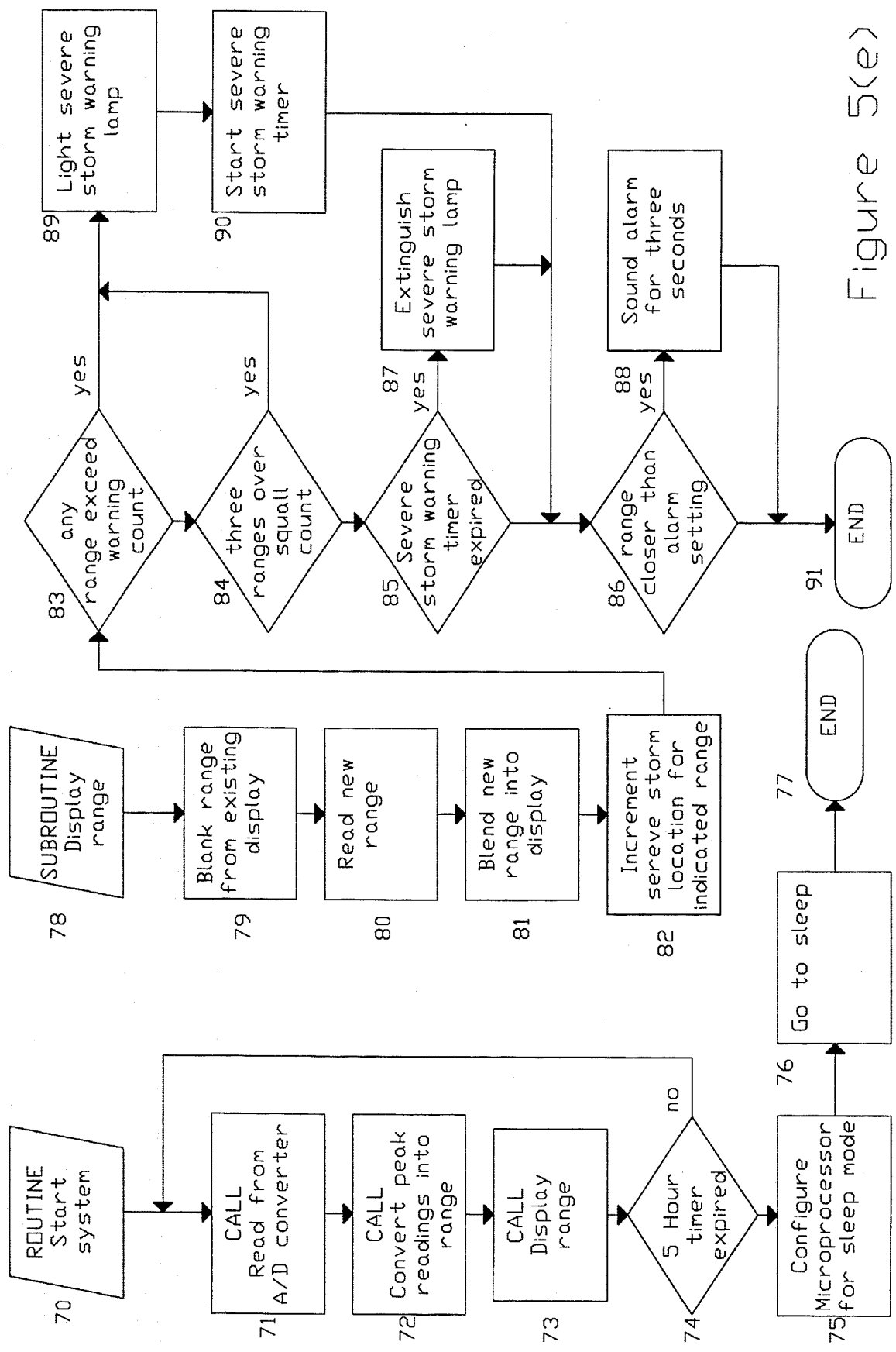

FIG. 5(e) describes the over-all system start up and operational routine, which includes the calls to read data from the A/D converter, convert valid peak readings into ranges, and display the ranges to the user. This routine is summarized in blocks 70–77, and includes the five hour timer which automatically powers down the device should this five hour interval pass without user activation of a switch.

Blocks 78–81 describe the subroutine for providing a visual display of the detected lightning events. In block 79, the microprocessor sets all LED control lines high to blank the display. The range determined in blocks 58–59 is fetched from storage in block 80. The blending of the new range data into the display at block 81 is done by complementing the new range data and logically ANDing the result with the blanked display value. Once the display is updated, the microprocessor increments the count in a register specially used to track activity in that range (block 82). The value in this register is then used to determine if a severe storm condition exists. Two tests are performed.

The first test performed, shown at block 83, is to determine if any of the individual range accumulators exceeds an activity count that is indicative of severe storm activity at that particular range. If so, the severe storm warning lamp is lit (block 89) and a fifteen minute timer is started (block 90). If this first test fails, a second test, shown at block 84, examines all of the range accumulators to see if "squall line" activity is present in three or more of the range accumulators. If so, once again the severe storm lamp is lit (block 89) and the fifteen minute timer is started (block 90).

If both of these tests fail, the current status of the fifteen minute timer is checked at block 85. If the timer has expired, the severe storm warning lamp is extinguished at block 87.

Once these activities are complete, the last range displayed is tested against the audible alarm range in block 86. If the currently displayed stroke is in the same distance range or in a closer range than the alert range, the audible alarm is sounded at block 88.

When this test is complete, the routine exits normally through block 91 and the microprocessor begins its cycle over again at block 74.

Of course other types of tests and analysis can be performed on the data to determine if it is valid and also the tests mentioned above could be omitted and a sufficiently accurate estimate of range could be obtained. Any number of tests can be performed on the data by simply altering the computer program.

Obviously, many modifications and variations of the present invention are possible. For example, instead of using just one pair of frequency bands to make the range determination, multiple pairs of frequency bands could be used so that the range of lightning strokes to greater distances and greater accuracy could be obtained.

It is to be understood that, within the scope of the appended claims, the invention may be practiced otherwise than as specifically described above.

What is claimed is:

1. A portable lightning detection and ranging device for determining the distance relative to said device of lightning discharges, said device comprising:

first antenna means including a first wire-wound ferrite core antenna with capacitive/inductive tuning to receive a first frequency signal of a magnetic field produced by a lightning discharge and to generate a first electrical signal corresponding to an amplitude of said first frequency signal;

second antenna means including a second wire-wound ferrite core antenna with capacitive/inductive tuning to receive a second frequency signal of a magnetic field produced by said lightning discharge and to generate a second electrical signal corresponding to an amplitude of said second frequency signal;

first amplifying means for amplifying said first electrical signal by a first predetermined amount of amplification to produce a first amplified electrical signal;

second amplifying means for amplifying said second electrical signal by a second but different predetermined amount of amplification to produce a second amplified electrical signal;

means for determining peak values of said first and second amplified electrical signals to determine first and second amplified peak values; and means comprising a two-dimensional computerized look-up table for utilizing pairs of said first and second amplified peak values to determine a range of said lightning discharge, said look-up table accepting as valid only pairs of said first and second amplified peak values if a ratio of these values is between the ratio of the frequencies of said first and second frequency signals and the ratio of the squares of those two frequencies.

2. The lightning detection and ranging device of claim 1, which includes means for determining if said pairs of said first and second amplified peak values can be peak values originating from the same lightning discharge by determining if a time separation of said amplified peak values is within a predetermined operational window.

3. The lightning detection and ranging device of claim 2, wherein the time separation of said pairs of amplified peak values is less than 120 microseconds.

4. The lightning detection and ranging device of claim 1, wherein a ratio of the frequencies to which the two antenna means are tuned is at least 2 and not more than 5.

5. A portable lightning detection and ranging device for determining the distance relative to said device of lightning discharges, said device comprising:

first antenna means including a first wire-wound ferrite core antenna with capacitive/inductive tuning to receive a first frequency signal of a magnetic field produced by a lightning discharge and to generate a first electrical signal corresponding to the amplitude of said first frequency signal;

second antenna means including a second wire-wound ferrite core antenna with capacitive/inductive tuning to receive a second frequency signal of a magnetic field produced by said lightning discharge and to generate a second electrical signal corresponding to the amplitude of said second frequency signal;

first amplifying means for amplifying said first electrical signal by a first predetermined amount of amplification to produce a first amplified electrical signal;

second amplifying means for amplifying said second electrical signal by a second but different predetermined amount of amplification to produce a second amplified electrical signal;

means for determining peak values of said first and second amplified electrical signals to determine first and second amplified peak values;

means for determining if said first and second amplified peak values can be peak values originating from the same lightning discharge by determining if a time separation of said amplified peak values is within a predetermined operational window and accepting such amplified peak values which fall within the operational window as time-wise acceptable first and second amplified peak values; and means comprising a two-dimensional computerized look-up table for utilizing pairs of said time-wise acceptable first and second amplified peak values to determine a range of said lightning discharge, said look-up table accepting as valid only pairs of said first and second amplified peak values if a ratio of these values is between a ratio of the frequencies of said first and second frequency signals and the ratio of the squares of those two frequencies.

6. The lightning detection and ranging device of claim 5, wherein the time separation of said pairs of amplified peak values is less than 120 microseconds.

7. The lightning detection and ranging device of claim 5, wherein the ratio of the frequencies to which the two antenna means are tuned is at least 2 and not more than 5.

8. A portable lightning detection and ranging device, sufficiently small to be carried in the pocket of a normal garment, for determining the distance relative to said device of lightning discharges, said device comprising:

first antenna means including a first wire-wound ferrite core antenna with capacitive/inductive tuning to receive a first frequency signal of a magnetic field produced by a lightning discharge and to generate a first electrical signal corresponding to the amplitude of said first frequency signal;

second antenna means including a second wire-wound ferrite core antenna with capacitive/inductive tuning to receive a second frequency signal of a magnetic field produced by said lightning discharge and to generate a second electrical signal corresponding to the amplitude of said second frequency signal;

first amplifying means for amplifying said first electrical signal by a first predetermined amount of amplification to produce a first amplified electrical signal;

second amplifying means for amplifying said second electrical signal by a second but different predetermined amount of amplification to produce a second amplified electrical signal;

means for determining peak values of said first and second amplified electrical signals to determine first and second amplified peak values;

means for determining if said first and second amplified peak values can be peak values originating from a same lightning discharge by determining if a time separation of said amplified peak values is within a predetermined operational window and accepting such amplified peak values which fall within the operational window as time-wise acceptable first and second amplified peak values; and means comprising a two-dimensional computerized look-up table for utilizing pairs of said time-wise acceptable first and second amplified peak values to determine the range of said lightning discharge.

9. The lightning detection and ranging device of claim 8, wherein the time separation of said pairs of amplified peak values is less than 120 microseconds.

10. The lightning detection and ranging device of claim 8, wherein said look-up table accepts as valid only pairs of said first and second amplified peak values if a ratio of these values is between a ratio of the frequencies of said first and second frequency signals and a ratio of the squares of those two frequencies.

11. The lightning detection and ranging device of claim 8, wherein the ratio of the frequencies to which the two antenna means are tuned is at least 2 and not more than 5.

12. A portable lightning detection and ranging device for determining the distance relative to said device of lightning discharges, said device comprising:

first antenna means including a first antenna with capacitive/inductive tuning to receive a first frequency signal of a magnetic field produced by a lightning discharge and to generate a first electrical signal corresponding to an amplitude of said first frequency signal;

second antenna means including a second antenna with capacitive/inductive tuning to receive a second frequency signal of a magnetic field produced by said lightning discharge and to generate a second electrical signal corresponding to an amplitude of said second frequency signal;

first amplifying means for amplifying said first electrical signal by a first predetermined amount of amplification to produce a first amplified electrical signal;

second amplifying means for amplifying said second electrical signal by a second but different predetermined amount of amplification to produce a second amplified electrical signal;

means for determining peak values of said first and second amplified electrical signals to determine first and second amplified peak values;

means for determining if said first and second amplified peak values can be peak values originating from a same lightning discharge by determining if a time separation of said amplified peak values is within a predetermined operational window and accepting such amplified peak values which fall within the operational window as time-wise acceptable first and second amplified peak values; and means comprising a two-dimensional computerized look-up table for utilizing pairs of said time-wise acceptable first and second amplified peak values to determine a range of said lightning discharge, said look-up table accepting as valid only pairs of said first and second amplified peak values if a ratio of these values is between a ratio of the frequencies of said first and second frequency signals and a ratio of the squares of those two frequencies.

13. The lightning detection and ranging device of claim 12, wherein a time separation of said pairs of amplified peak values is less than 120 microseconds.

14. The lightning detection and ranging device of claim 12, wherein the ratio of the frequencies to which the two antenna means are tuned is at least 2 and not more than 5.

15. The lightning detection and ranging device of claim 12, wherein said first antenna means includes a first wire-wound ferrite core and said second antenna means includes a second wire-wound ferrite core.

16. A lightning detection and ranging device for determining the distance relative to said device of lightning discharges, said device comprising:

first antenna means including a first antenna with capacitive/inductive tuning to receive a first frequency signal of a magnetic field produced by a lightning discharge and to generate a first electrical signal corresponding to an amplitude of said first frequency signal;

second antenna means including a second antenna with capacitive/inductive tuning to receive a second frequency signal of a magnetic field produced by said lightning discharge and to generate a second electrical signal corresponding to an amplitude of said second frequency signal;

first amplifying means for amplifying said first electrical signal by a first predetermined amount of amplification to produce a first amplified electrical signal;

second amplifying means for amplifying said second electrical signal by a second but different predetermined amount of amplification to produce a second amplified electrical signal;

means for determining peak values of said first and second amplified electrical signals to determine first and second amplified peak values;

means for determining if said first and second amplified peak values can be peak values originating from a same lightning discharge by determining if a time separation of said amplified peak values is within a predetermined operational window and accepting such amplified peak values which fall within the operational window as time-wise acceptable first and second amplified peak values; and means comprising a two-dimensional computerized look-up table for utilizing pairs of said time-wise acceptable first and second amplified peak values to determine a range of said lightning discharge, said look-up table accepting as valid only pairs of said first and second amplified peak values if a ratio of these values is between a ratio of the frequencies of said first and second frequency signals and a ratio of the squares of those two frequencies.

17. The lightning detection and ranging device of claim 16, wherein the time separation of said pairs of amplified peak values is less than 120 microseconds.

18. The lightning detection and ranging device of claim 16, wherein the ratio of the frequencies to which the two antenna means are tuned is at least 2 and not more than 5.

19. The lightning detection and ranging device of claim 16, wherein said first antenna means includes a first wire-wound ferrite core and said second antenna means includes a second wire-wound ferrite core.

20. The lightning detection and ranging device of claim 16, wherein the device is portable.

* * * * *

UNITED STATES PATENT AND TRADEMARK OFFICE
CERTIFICATE OF CORRECTION

PATENT NO. : 5,541,501

DATED : July 30, 1996

INVENTOR(S) : Edward F. Shaver et al

It is certified that error appears in the above-identified patent and that said Letters Patent is hereby corrected as shown below:

Col. 2, lines 46, 51, 62 and 64, and

Col. 3, line 13, change $H_{100\ 1}$ to: $H_{\phi 1}$.

Col. 2, lines 47, 53, 58, and 59, change $H_{100\ 2}$ to: $H_{\phi 2}$.

Signed and Sealed this

Nineteenth Day of November, 1996

Attest:

BRUCE LEHMAN

*Attesting Officer*      *Commissioner of Patents and Trademarks*